United States Patent
Kim et al.

(10) Patent No.: US 9,251,904 B2
(45) Date of Patent: Feb. 2, 2016

(54) NONVOLATILE MEMORY DEVICE AND MEMORY SYSTEM INCLUDING THE SAME

(71) Applicant: SAMSUNG ELECTRONICS CO., LTD., Suwon-Si, Gyeonggi-Do (KR)

(72) Inventors: Doohyun Kim, Ansan-Si (KR); Hyun Jun Yoon, Seongnam-Si (KR); Donghun Kwak, Hwaseong-Si (KR); Kitae Park, Seongnam-Si (KR); Changyeon Yu, Yongin-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/458,567

(22) Filed: Aug. 13, 2014

(65) Prior Publication Data

US 2015/0179272 A1   Jun. 25, 2015

(30) Foreign Application Priority Data

Dec. 19, 2013   (KR) .......................... 10-2013-0159550

(51) Int. Cl.
  *G11C 29/56*   (2006.01)
  *G11C 16/26*   (2006.01)

(52) U.S. Cl.
  CPC ................ *G11C 16/26* (2013.01); *G11C 29/56* (2013.01)

(58) Field of Classification Search
  CPC .................................. G11C 29/56; G11C 16/26
  See application file for complete search history.

(56) References Cited

U.S. PATENT DOCUMENTS

| 5,859,858 | A | 1/1999 | Leeman | |
|---|---|---|---|---|
| 5,920,502 | A | 7/1999 | Noda et al. | |
| 8,159,892 | B2 | 4/2012 | Kang | |
| 8,245,099 | B2 | 8/2012 | Lasser | |
| 2008/0316822 | A1* | 12/2008 | Ahn | G06F 11/1068 365/185.09 |
| 2009/0003058 | A1* | 1/2009 | Kang | G11C 11/5642 365/185.03 |
| 2009/0168543 | A1* | 7/2009 | Kim | G11C 16/26 365/185.29 |
| 2010/0287427 | A1 | 11/2010 | Kim et al. | |
| 2010/0296350 | A1* | 11/2010 | Kim | G11C 11/5642 365/189.15 |

FOREIGN PATENT DOCUMENTS

JP  2009259326 A   11/2009
KR  101005155 B1   1/2011

* cited by examiner

*Primary Examiner* — Tuan T Nguyen
*Assistant Examiner* — Khamdan Alrobaie
(74) *Attorney, Agent, or Firm* — Volentine & Whitt, PLLC

(57) ABSTRACT

A nonvolatile memory device may include a memory cell array which is arranged in rows and columns and has multi-level memory cells; a voltage generator providing a plurality of read voltages to a selected row of the memory cell array; and control logic performing a plurality of page read operations using the read voltages. A first read voltage and a second read voltage among the plurality of read voltages are each associated with a higher probability of occurrence of a bit read error than at least one other read voltage among the plurality of read voltages. The control logic uses the first read voltage and the second read voltage in different page read operations than each other.

20 Claims, 17 Drawing Sheets

NONVOLATILE MEMORY DEVICE AND MEMORY SYSTEM INCLUDING THE SAME

CROSS-REFERENCE TO RELATED APPLICATIONS

This U.S. non-provisional patent application claims priority under 35 U.S.C. §119 of Korean Patent Application No. 10-2013-0159550, filed on Dec. 19, 2013, the entire contents of which are hereby incorporated by reference.

FIELD

The present inventive concept herein relates to semiconductor memory devices, and more particularly, to a nonvolatile memory device and a memory system including the same.

BACKGROUND

Semiconductor memory devices may be classified into volatile semiconductor memory devices and nonvolatile semiconductor memory devices. Volatile semiconductor memory devices have a high read/write speed but have a disadvantage of losing their stored data when their power supplies are interrupted. Nonvolatile semiconductor memory device retain their stored data even when their power supplies are interrupted. Thus, nonvolatile memory devices are used to remember contents that have to be preserved regardless of whether power supplies are supplied or not.

Examples of nonvolatile semiconductor memory devices include a mask read-only memory, a programmable read only memory (PROM), an erasable programmable read only memory (EPROM), an electrically erasable programmable read only memory (EEPROM), etc.

A typical example of a nonvolatile memory device is a flash memory device. A flash memory device is being widely used as a voice and image data storage medium of information devices such as a computer, a cellular phone, a PDA, a digital camera, a camcorder, a voice recorder, a MP3 player, a personal portable terminal, a handheld PC, a game machine, a fax scanner, a printer (hereinafter it is referred to as 'host').

As a high integration requirement for a memory device increases, multi-bit memory devices that store multi bit in one memory cell are becoming more common.

SUMMARY

Embodiments of the inventive concept provide a nonvolatile memory device. The nonvolatile memory device may include a memory cell array which is arranged in rows and columns and has multi-level memory cells; a voltage generator which is configured to provide a plurality of read voltages to a selected row of the memory cell array; and control logic which is configured to perform a plurality of page read operations using the read voltages. A first read voltage and a second read voltage among the plurality of read voltages are each associated with a higher probability of occurrence of a bit read error than at least one other read voltage among the plurality of read voltages. The control logic is further configured to use the first read voltage and the second read voltage in different page read operations than each other.

Embodiments of the inventive concept also provide a memory system. The memory system may include a nonvolatile memory device which is configured to perform a plurality of page read operations using a plurality of read voltages; and a controller configured to control the nonvolatile memory device to perform the page read operations. A first read voltage and a second read voltage among the plurality of read voltages are each associated with a higher probability of occurrence of a bit read error than at least one other read voltage among the plurality of read voltages. The controller is configured to control the nonvolatile memory device to use the first read voltage and the second read voltage in different page read operations than each other.

Embodiments of the inventive concept further provide a memory system including a nonvolatile memory device. The nonvolatile memory device comprises: a memory cell array comprising a plurality of multi-level memory cells; and a voltage generator which is configured to provide a plurality of read voltages. The memory device is configured to perform a plurality of page read operations on at least one multi-level memory cell among the plurality of multi-level memory cells by applying at least one of the read voltages to the one multi-level memory cell during each of the plurality of page read operations. Each of the plurality of read voltages is associated with a corresponding probability of occurrence of a bit read error. First and second voltages among the plurality of read voltages are associated with greatest probabilities of occurrence of a bit read error among the plurality of read voltages. The memory device is further configured to apply the first read voltage and the second read voltage to the one of multi-level memory cell during different page read operations than each other.

BRIEF DESCRIPTION OF THE FIGURES

Preferred embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION

Figure 1:
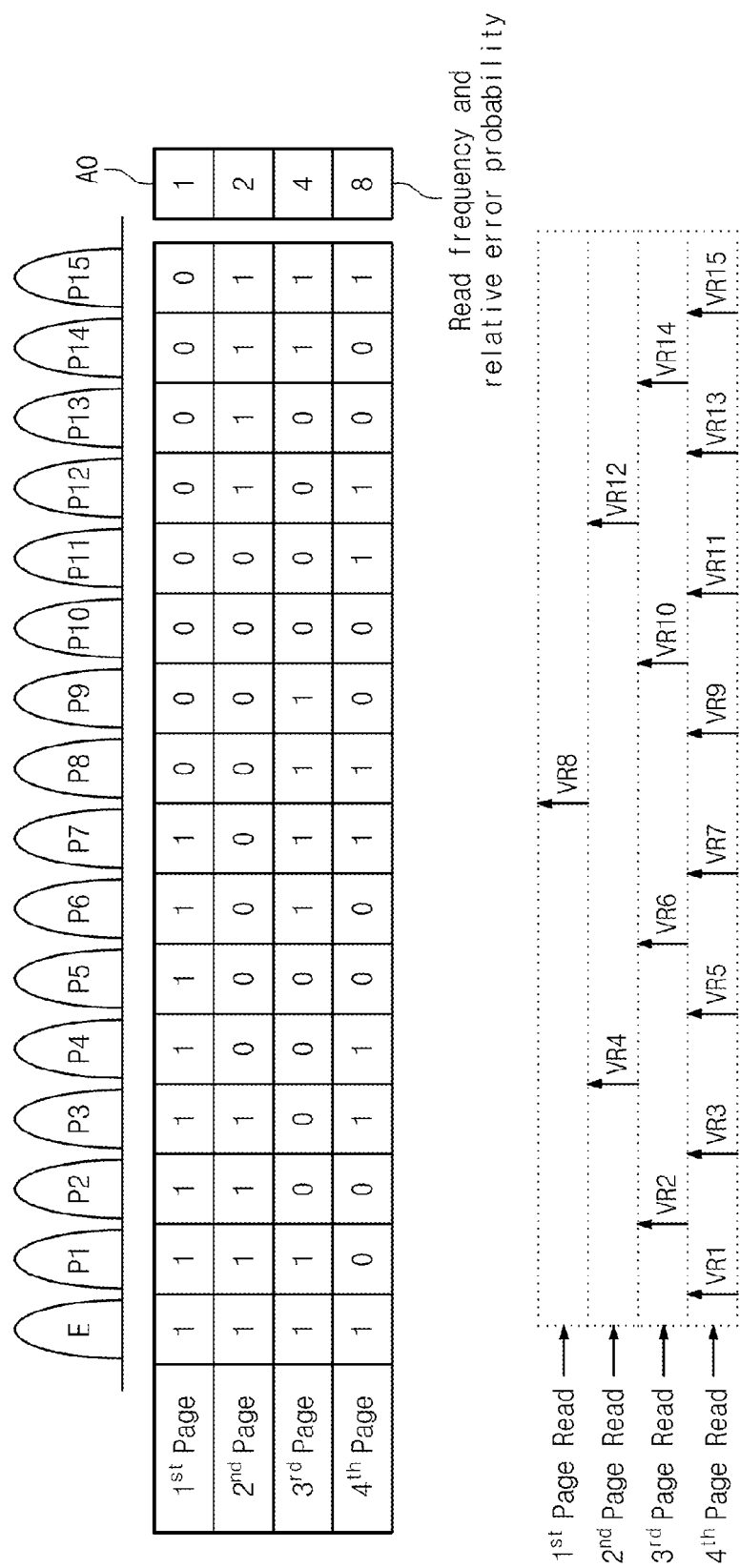
FIGS. 1 and 2 are drawings illustrating examples of ordering of bit patterns for page read operations.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

Development of multi level data storage technologies is being accelerated to improve price competitiveness. For example, the number of bits being stored in a memory cell increases. As the number of bits being stored in a memory cell increases, various problems such as coupling, error rate, and limits on the number of programming operations and read operations, etc. are expected. It is becoming important to determine the ordering of bit patterns that can minimize those problems. The ordering of bit patterns may also be called a bit assigning method. The bit pattern means the pattern of a column of bits being stored in one memory cell. For example, in the case that 4-bit data is stored in one memory cell, the bit pattern has any one of "1111", "0000" and values between "1111" and "0000" and the ordering of bit patterns, that is, the bit assigning method, may be variously constituted according to the number of data bits being stored in the memory cell. Examples of ordering of bit patterns, that is, bit assigning methods, are illustrated in FIGS. 1 and 2.

Figure 2:
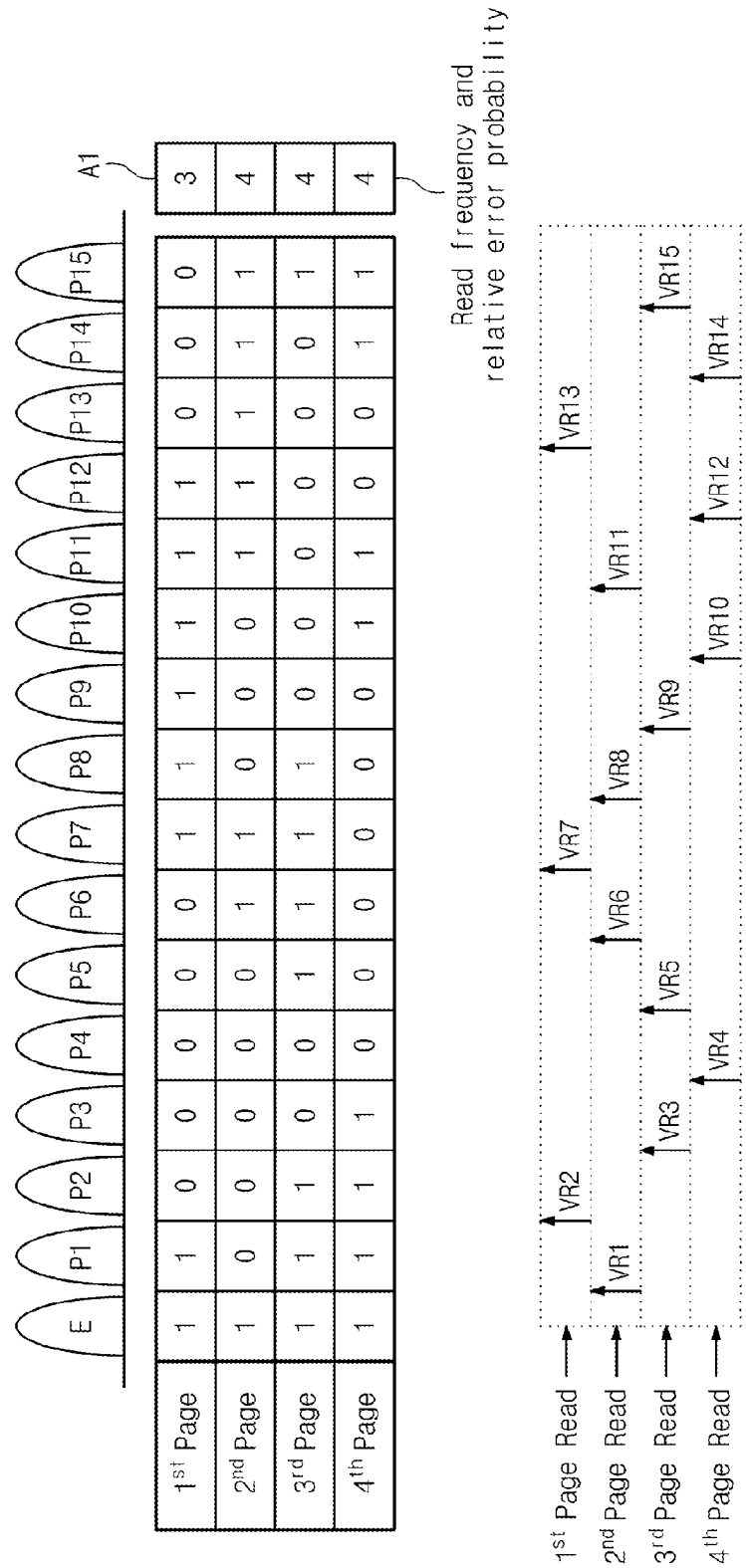

Bit patterns illustrated in FIGS. 1 and 2 correspond to the case that 4-bit data is stored in a memory cell. In this case, 4-page data is stored in memory cells of a selected word line respectively. Each memory cell is programmed to have any one of an erase state E and program states P1~P15.

For example, referring to FIG. 1, in the case that a memory cell has the erase state E, "1111" data is stored in the memory cell. In the case that a memory cell has the program state P1, "0111" data is stored in the memory cell. That is, the data stages E and P1~P15 are assigned to have respective bit patterns.

Instead of assigning bit patterns corresponding to the data states E and P1~P15 as illustrated in FIG. 1, bit patterns corresponding to the data states E and P1~P15 may be assigned as illustrated in FIG. 2. For example, in the case that a memory cell has an erase state E, "1111" data is stored in the memory cell. In the case that a memory cell has the program state P1, "1101" data is stored in the memory cell. The ordering of bit patterns may not limited to the examples illustrated in FIGS. 1 and 2.

An operation of reading data stored in a memory cell is a process of judging, determining, or ascertaining to which state a threshold voltage of the memory cell corresponds and obtaining corresponding 4-bit data according to the result of that judgment. A read operation is performed by a page unit and is performed to judge, determine, or ascertain whether data of a memory cell that belongs to each page is a '0' or a '1' by checking whether a threshold voltage of the memory cell is greater than or less than a state boundary on the basis of the state boundary in which '0' and '1' are distinct from each other.

For example, in the case of programming memory cells to have the ordering of bit patterns illustrated in FIG. 1, first page data is read by performing a read operation once using a read voltage VR8 corresponding to a state boundary between states P7 and P8. Second page data is read by performing a read operation twice, using read voltages VR4 and VR12 corresponding to a state boundary between states P3 and P4 and a state boundary between states P11 and P12 respectively. Third page data is read by performing a read operation four times using read voltages VR2, VR6, VR10 and VR14 corresponding to a state boundary between states P1 and P2, a state boundary between states P5 and P6, a state boundary between states P9 and P10 and a state boundary between states P13 and P14 respectively. Fourth page data is read by performing a read operation eight times using read voltages VR1, VR3, VR5, VR7, VR9, VR11, VR13 and VR15 corresponding to a state boundary between states E and P1, a state boundary between states P2 and P3, a state boundary between states P4 and P5, a state boundary between states P6 and P7, a state boundary between states P8 and P9, a state boundary between states P10 and P11, a state boundary between states P12 and P13 and a state boundary between states P14 and P15 respectively.

In the case of programming memory cells to have the ordering of bit patterns illustrated in FIG. 2, read voltages are determined in such manner as that described above and read operations are performed using the determined read voltage. For example, first page data is read by performing a read operation three times using read voltages VR2, VR7 and VR13. Second page data is read by performing a read operation four times using read voltages VR1, VR6, VR8 and VR11. Third page data is read by performing a read operation four times using read voltages VR3, VR5, VR9 and VR15. Fourth page data is read by performing a read operation 4 times using read voltages VR4, VR10, VR12 and VR14.

Multi-bit data programmed according to a particular ordering of bit patterns is read by a read method corresponding to the particular ordering of bit patterns. That is, a method of programming multi-bit data according to the ordering of bit patterns corresponds to one read method. For example, multi-bit data stored according to the ordering of bit patterns illustrated in FIG. 1 is read by the read method described above with respect to FIG. 1. If multi-bit data stored according to the ordering of bit patterns illustrated in FIG. 1 is read by the read method described above with respect to FIG. 2, data different from the stored data is read. Thus, if the ordering of bit patterns is determined, a programming method and a read method corresponding to the determined ordering of bit patterns are determined. That means that if multi-bit data is stored according to a programming method corresponding to the determined ordering of bit patterns, the multi-bit data is read according to a read method corresponding to the programming method (or the determined ordering of bit patterns).

In the case of programming data according to the ordering of bit patterns illustrated in FIGS. 1 and 2, if the error probabilities associated with the different read voltages all are assumed to be the same as each other, then an overall error probability that occurs when reading first through fourth page data respectively corresponds to the number of times a read operation is performed as illustrated in right boxes A0 and A1 in FIGS. 1 and 2, respectively. For example, an error probability distribution for reading first through fourth page data, respectively, with the ordering of bit patterns illustrated in FIG. 1, that is, the bit assigning method of FIG. 1, is 1:2:4:8, and an error probability distribution for reading first through fourth page data, respectively, with the bit assigning method illustrated in FIG. 2 is 3:4:4:4. Since a memory system has to be designed to be able to correct an error with respect to a page having the highest error probability, a memory system adopting the bit assigning method illustrated in FIG. 1 needs an error correction circuit having relatively greater error correction ability as compared with a memory system adopting the bit assigning method illustrated in FIG. 2. The bit assigning method illustrated in FIG. 2 can easily embody a uniform error probability distribution (i.e., exhibits a uniform read latency). Here, a uniform error probability distribution does not mean that the error probability for reading each page of data is exactly identical with every other page of data, but instead means that error probability is distributed relatively evenly among the page read operations.

Figure 3:
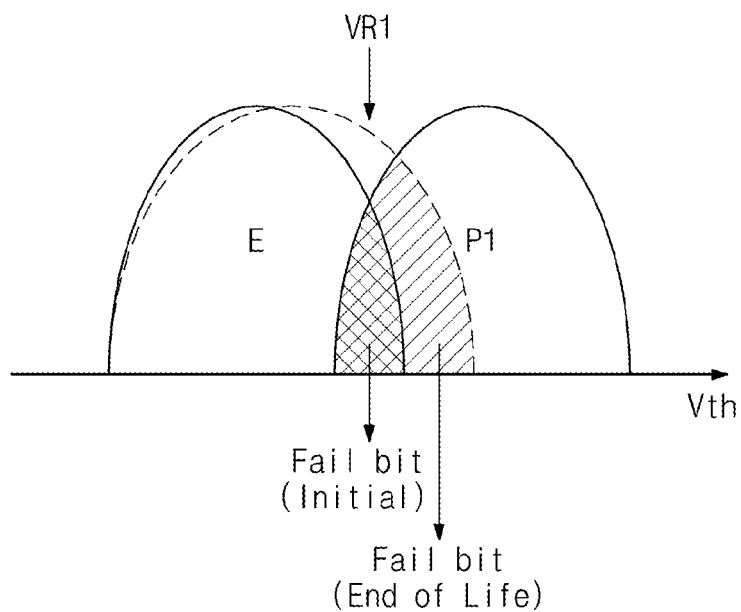
FIG. 3 is a drawing for explaining a fail bit of a memory cell.

FIG. 3 is a drawing for explaining a failure bit of a memory cell.

Referring to FIG. 3, a failure bit between a state E and a state P1 of a memory cell is described. A read voltage VR1 may be determined as a voltage corresponding to a state boundary of states E and P1. However the probability distributions of the threshold voltages of memory cells programmed to the state E and the state P1 may overlap each other as illustrated in FIG. 3. In the case of a memory cell having a threshold voltage in a region in which a diagonal line is drawn in FIG. 3, in a read operation using the read voltage VR1, a bit read error or "fail bit" may occur. Thus, a bit read failure may occur at the rate corresponding to the probability of memory cells having a threshold voltage in the region where the diagonal line is drawn. A bit read error may occur at all of the state boundaries.

In initial stage of the lives of memory cells, the threshold voltage distributions of memory cells programmed to the state E and the state P1 can be illustrated as shown with solid lines in FIG. 3. If a read operation is repeatedly performed, the threshold voltage distribution of memory cells programmed to the state E may be changed at the end of life of the memory cell to be as shown with a dashed line in FIG. 2. If the threshold voltage distribution of memory cells programmed to the state E is changed to be like as shown with a dashed line in FIG. 3, a bit read error in a read operation using the read voltage VR1 may occur at the rate of corresponding to a region in which the state E illustrated by a dashed line and the state P1 illustrated by a solid line overlap each other in FIG. 3. That is, in a read operation using the read voltage VR1, as the number of times a read operation is performed increases, the probability that a bit read error occurs may increase.

Figure 4:
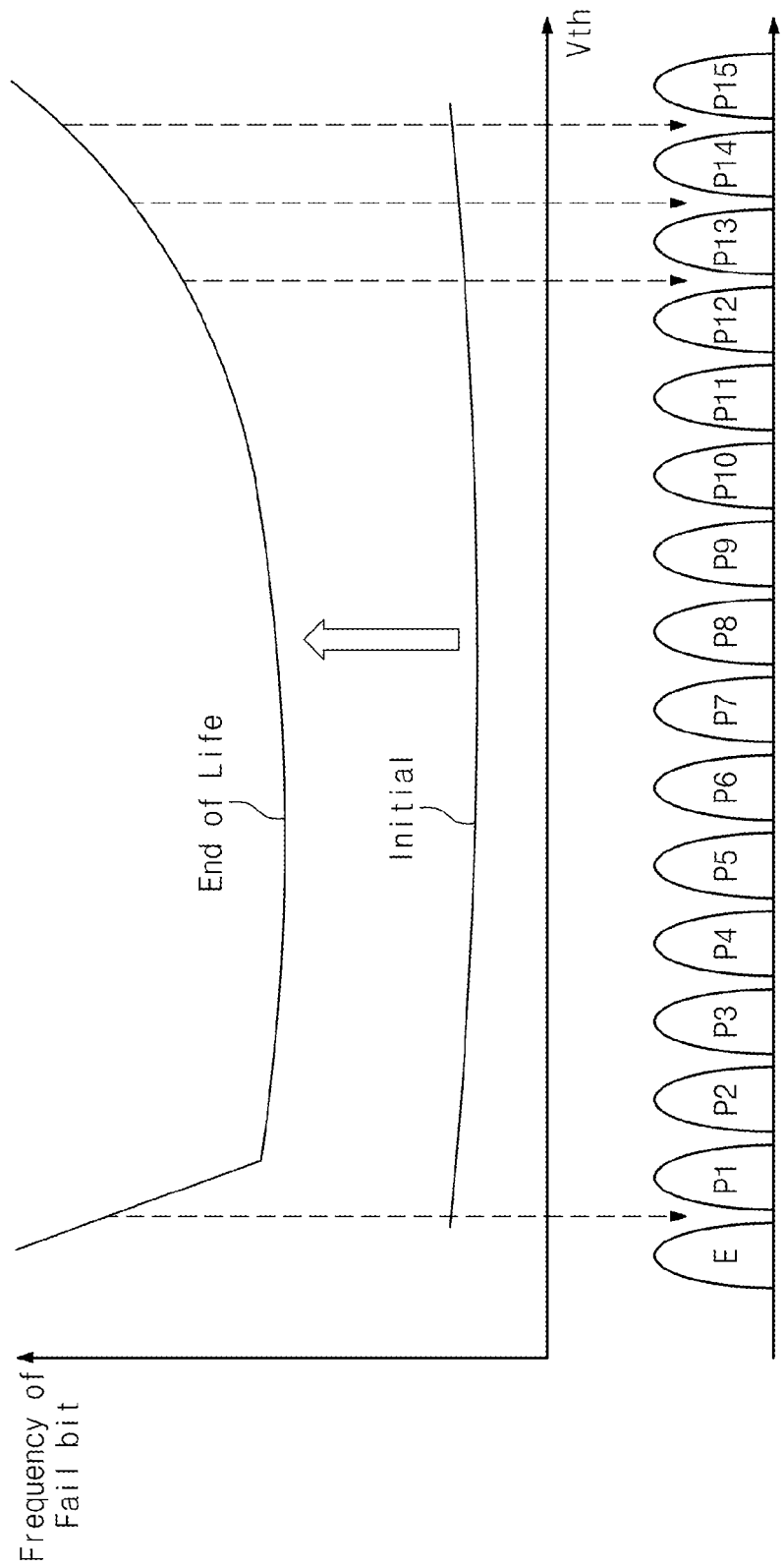
FIG. 4 is a graph illustrating an occurrence frequency of a fail bit in accordance with states of a threshold voltage of a memory cell.

FIG. 4 is a graph illustrating an occurrence frequency of a bit read error in accordance with states of a threshold voltage of a memory cell.

Referring to FIG. 4, a case that 4-bit data is stored in one memory cell will be described as an illustration. An occurrence frequency of a bit read error may vary or differ among the states E and P1~P15 of memory cells. In the initial stage of life of the memory cells, the occurrence frequency of a bit read error may be uniform at the state boundaries between all of the states E and P1~P15. As a read operation is repeated, an occurrence frequency of a bit read error may increase. However, an occurrence frequency of a bit read error may increase differently for different state boundaries between the various states E and P1~P15. An occurrence frequency of a bit read error at the end of life of the memory cell may increase more greatly at a state boundary between states E and P1, a state boundary between states P12 and P13, a state boundary between states P13 and P14 and a state boundary between states P14 and P15, compared to the increase at the other state boundaries. The error occurrence probability of each page at the end of life of the memory cell may increase in page read operations by read voltages corresponding to these state boundaries. Thus, a bit assigning method may be provided in consideration of not only an error probability distribution, but also an occurrence frequency of a bit read error corresponding to a read voltage, to make the error occurrence probabilities of the different page read operations more uniform, and more particularly as repeated read operations are performed on the memory cells over time.

Figure 5:
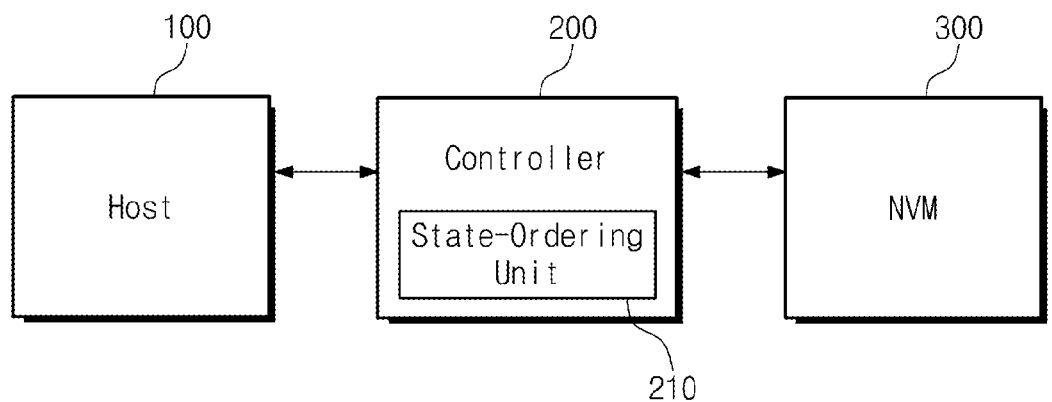
FIG. 5 is a block diagram illustrating an example memory system.

FIG. 5 is a block diagram illustrating an example of a memory system. Referring to FIG. 5, a memory system uses a nonvolatile memory device 300 as a storage medium. The memory system may include a host 100, a controller 200 and a nonvolatile memory device 300.

Controller 200 can control nonvolatile memory device 300 in response to a request of host 100. Controller 200 may include a state-ordering unit 210. State-ordering unit 210 can assign bit patterns to states of threshold voltages of a memory cell so that page read operations are performed in nonvolatile memory device 300. For example, controller 200 can control nonvolatile memory device 300 to perform a read operation using the bit assigning method illustrated in FIG. 2. State-ordering unit 210 can set the bit assigning method so that page read operations of nonvolatile memory device 300 have a uniform error probability distribution. State-ordering unit 210 can also set the bit assigning method so that read operations by read voltages having a high occurrence frequency of a bit read error are not performed in the same page read operation together with one another. For example, state-ordering unit 210 can set the bit assigning method so that read operations by the read voltages VR1, VR13, VR14 and VR15 illustrated in FIG. 2 are performed in different page read operations respectively.

Nonvolatile memory device 300 is configured to perform a read operation in response to a request of controller 200. Page data stored in a memory cell can be read by a page read operation. Nonvolatile memory device 300 can transmit the read page data to controller 200. For example, in the case of a memory cell in which 4-bit data is stored, according to the read method illustrated in FIG. 2, each page data can be read by each page operation (1st page read, 2nd page read, 3rd page read, 4th page read) to have a uniform error probability distribution. A first page read operation can be performed by read voltages VR2, VR7 and VR13. A second page read operation can be performed by read voltages VR1, VR6, VR8 and VR11. A third page read operation can be performed by read voltages VR3, VR5, VR9 and VR15. A fourth page read operation can be performed by read voltages VR4, VR10, VR12 and VR14. At the end of life of the memory cell, read voltages VR1, VR13, VR14 and VR15 having a high occurrence frequency of a bit read error may be used in different page read operations. Thus, the page read operations (1st page read, 2nd page read, 3rd page read, 4th page read) can be performed with a uniform error occurrence probability.

Figure 6:
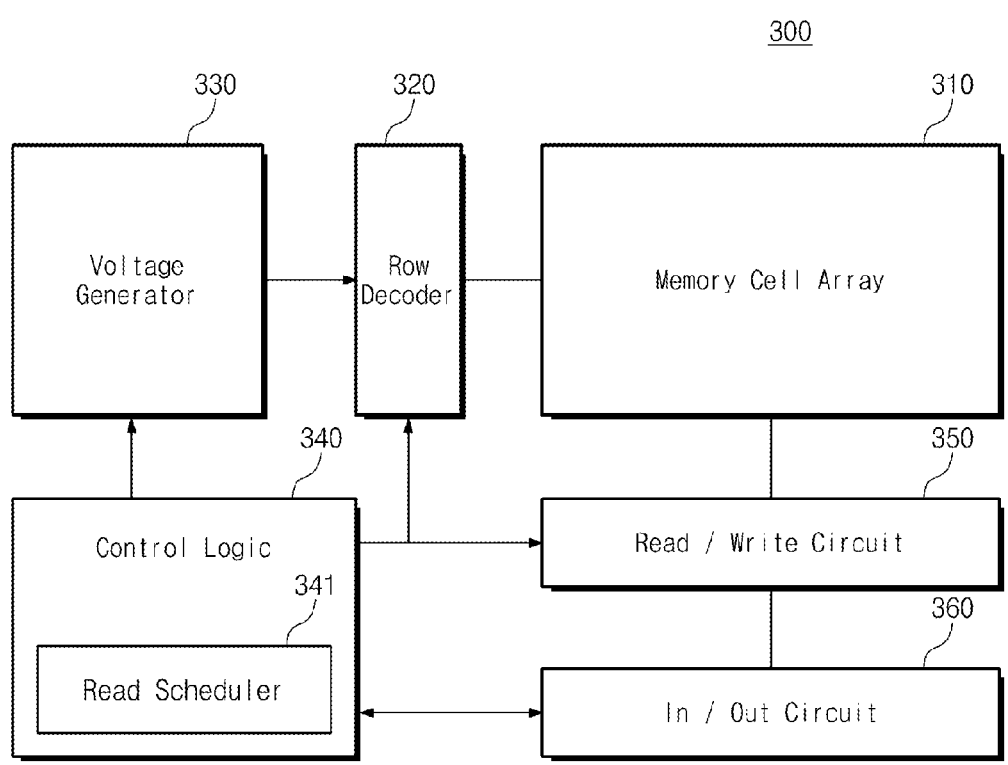
FIG. 6 is a block diagram illustrating an example nonvolatile memory device illustrated in FIG. 5.

FIG. 6 is a block diagram illustrating a nonvolatile memory device illustrated in FIG. 5 in accordance with exemplary embodiments of the inventive concept. Referring to FIG. 6, nonvolatile memory device 300 may be, for example, a NAND flash memory device. However, the inventive concept may not be limited to the NAND flash memory device. For example, the inventive concept may be applied to a MRAM, a PRAM, a FRAM, a NOR type flash memory device, etc.

Nonvolatile memory device 300 includes a memory cell array 310 having memory cells arranged in rows (word lines WL) and columns (bit lines BL). Each memory cell stores 1-bit data or M (multi)-bit data (M is an integer of 2 or more). Each memory cell may be embodied by a memory cell having a charge storage layer like a floating gate or a charge trap layer, a memory cell having a variable resistance device, or the like. Memory cell array 310 may be embodied to have a well known single-layer array structure (or a two dimensional array structure) or a multi-layer array structure (or a three dimensional array structure).

A row decoder 320 may be configured to perform a select operation and a drive operation with respect to rows of memory cell array 310. A voltage generation circuit 330 is controlled by control logic 340 and may be configured to generate voltages (e.g., a programming voltage, a pass voltage, an erase voltage, a read voltage, etc.) needed for read operations. A read/write circuit 350 is controlled by control logic 340 and can operate as a sense amplifier or a write driver according to an operation mode. For example, during a read operation, read/write circuit 350 can operate as a sense amplifier sensing data from memory cells of a selected row (or selected memory cells). The read data may be provided to the outside of nonvolatile memory device 300 through an input/output circuit 360 by a predetermined input/output unit. During a programming operation, read/write circuit 350 can operate as a write driver driving memory cells of a selected row according to program data. Read/write circuit 350 may include buffers corresponding to bit lines or pairs of bit lines. In the case that each memory cell stores multi-bit/multi-level data, each page buffer of read/write circuit 350 is configured to have two or more latches. Input/output circuit 360 may be configured to interface with the outside of nonvolatile memory device 300 (for example, a controller or a host).

Control logic 340 may include a read scheduler 341 configured to control a read operation. Read scheduler 341 can control a read operation according to a read method (for example, the read method illustrated in FIG. 2) corresponding to a bit assigning method. That is, read scheduler 341 may be configured to perform a read operation corresponding to a bit assigning method having a uniform error probability distribution. Read scheduler 341 may also be configured to perform a read operation corresponding to a bit assigning method considering an occurrence frequency of a bit read error which may differ among the different read voltages for the different states.

Read scheduler 341 may be configured to be programmed by an external device (for example, a controller). For example, in some embodiments a read algorithm of read scheduler 341 can be programmed through a setting of a register set by controller 200 on power-up. On the other hand, in some embodiments the read algorithm of read scheduler 341 can be fixed in hardware.

Figure 7:
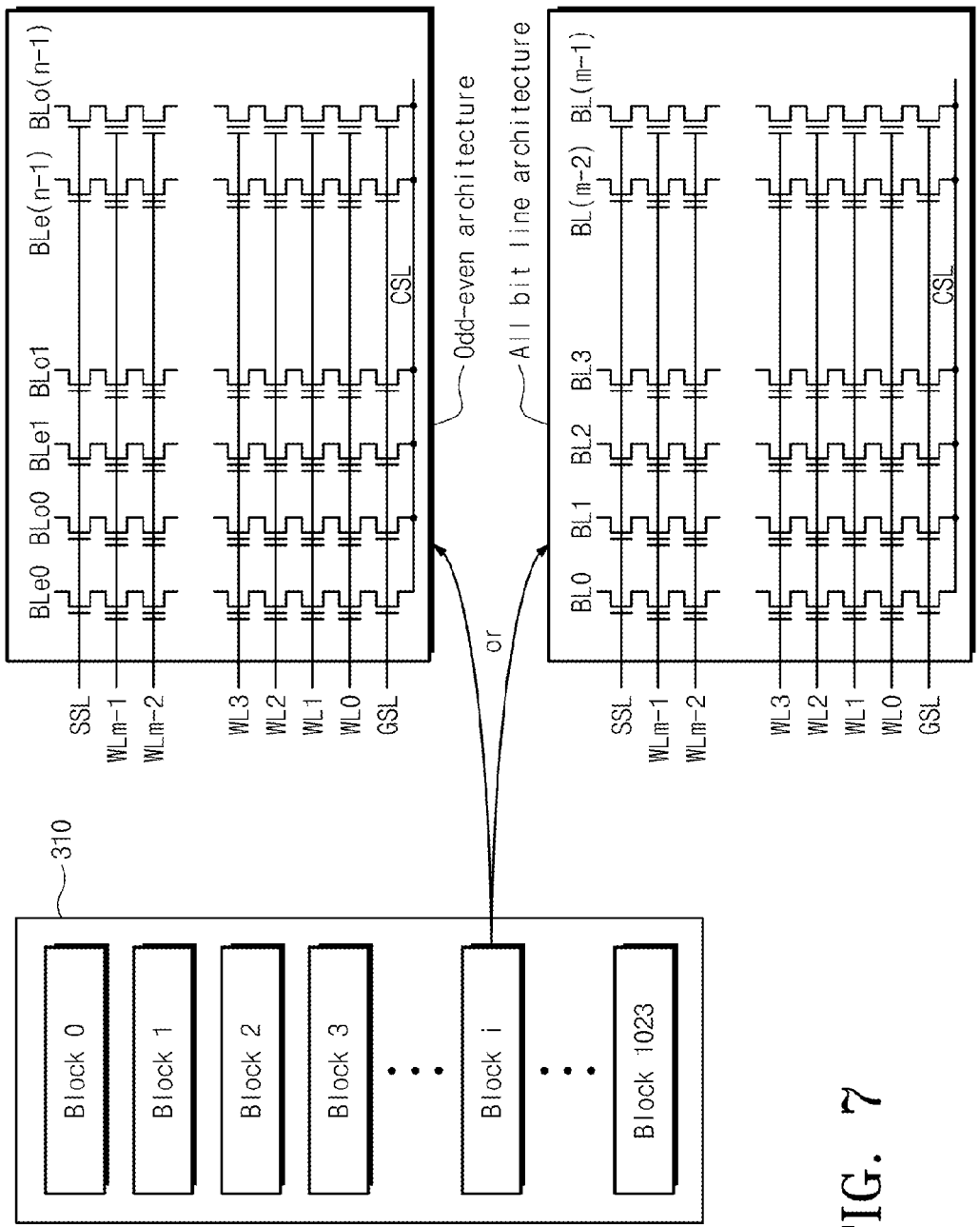
FIG. 7 is a drawing illustrating an example of a memory cell array constituted by memory blocks for an all-bit line memory architecture or an odd-even memory architecture.

FIG. 7 is a drawing illustrating an example of a memory cell array constituted by memory blocks for an all-bit line memory architecture or an odd-even memory architecture. Illustrative structures of memory cell array 310 will be described. For example, a NAND flash memory device will be described wherein memory cell array 310 is divided into 1024 memory blocks. Data stored in each memory block can be erased at a time. The memory block is a minimum unit of storage devices in which all the data is erased at a time. Each memory block includes a plurality of columns corresponding to bit lines (for example, bit lines of 1 KB) respectively.

In an embodiment called an all-bit line (ABL) architecture, all the bit lines of a memory block can be selected at the same time during read and programming operations. Storage devices which belong to a common word line and are connected to all the bit lines can be programmed at the same time. A plurality of storage devices that belong to the same column can be connected in series to constitute a NAND string. One end of the NAND string may be connected to a corresponding bit line through a select transistor being controlled by a string select line SSL and the other end of the NAND string may be connected to a common source line CSL through a select transistor being controlled by a ground select line GSL.

In another embodiment called an odd-even architecture, bit lines may be divided into even bit lines BLe and odd bit lines BLo. In the odd-even bit line architecture, storage devices which belong to a common word line and are connected to the odd bit lines may be programmed at a first time and storage devices which belong to a common word line and are connected to the even bit lines may be programmed at a second time. In some embodiments, this order may be reversed. Data may be programmed in other memory blocks and may be read from other memory blocks. That operation may be performed at the same time.

Figure 8:
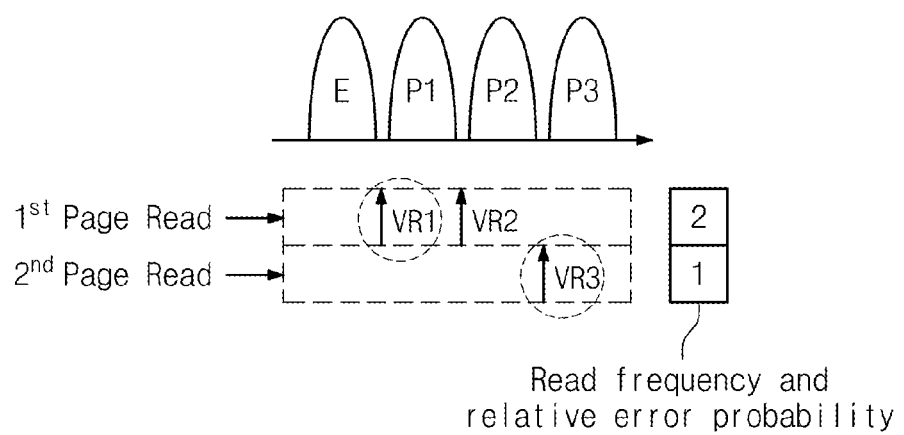
FIG. 8 is a drawing for explaining a read operation of an example embodiment of a memory cell storing 2-bit data.

FIG. 8 is a drawing for explaining a read operation of an example embodiment of a memory cell storing 2-bit data. Referring to FIG. 8, the memory cell may have four different threshold voltage states. Nonvolatile memory device 300 can output data stored in the memory cell by page read operations (1st page read, 2nd page read).

First page data can be read by read voltages VR1 and VR2. Second page data can be read by read voltages VR3. Thus, assuming the error probability is the same for all read voltages, an error probability distribution of the read method illustrated in FIG. 8 is 2:1. However, in similarity to the example shown in FIG. 4, the read voltages VR1 and VR3 have a higher occurrence frequency of a bit read error compared to the read voltage VR2. Accordingly, as illustrated in FIG. 8, the read voltages VR1 and VR3 can be used in different page read operations than each other. According to a read method of a memory cell illustrated in FIG. 8, the page read operations (1st page read, 2nd page read) may have a uniform error occurrence probability.

Figure 9:
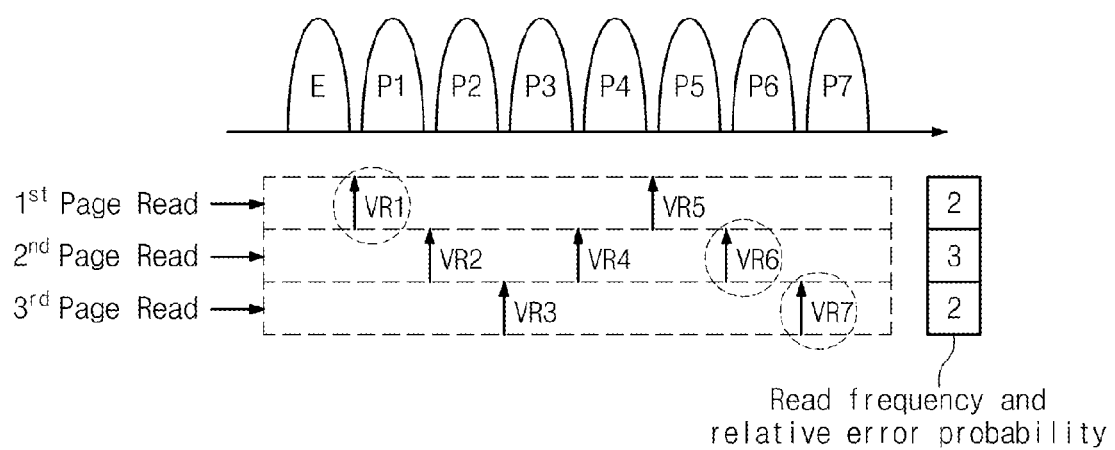
FIG. 9 is a drawing for explaining a read operation of an example embodiment of a memory cell storing 3-bit data.

FIG. 9 is a drawing for explaining a read operation of an example embodiment of a memory cell storing 3-bit data. Referring to FIG. 9, the memory cell may have eight different threshold voltage states. Nonvolatile memory device 300 can output data stored in the memory cell by page read operations (1st page read, 2nd page read, 3rd page read).

First page data can be read by read voltages VR1 and VR5. Second page data can be read by read voltages VR2, VR4 and VR6. Third page data can be read by read voltages VR3 and VR7. Thus, assuming the error probability is the same for all read voltages, an error probability distribution for reading first through fourth page data, respectively, with the read method illustrated in FIG. 9 is 2:3:2. However, in similarity to the example shown in FIG. 4, the read voltages VR1, VR6 and VR7 have a higher occurrence frequency of a bit read error compared to the other read voltages. Accordingly, as illustrated in FIG. 9, the read voltages VR1, VR6 and VR7 can be used in different page read operations than each other. According to a read method of a memory cell illustrated in FIG. 9, the page read operations (1st page read, 2nd page read, 3rd page read) may have a uniform error occurrence probability.

Figure 10:
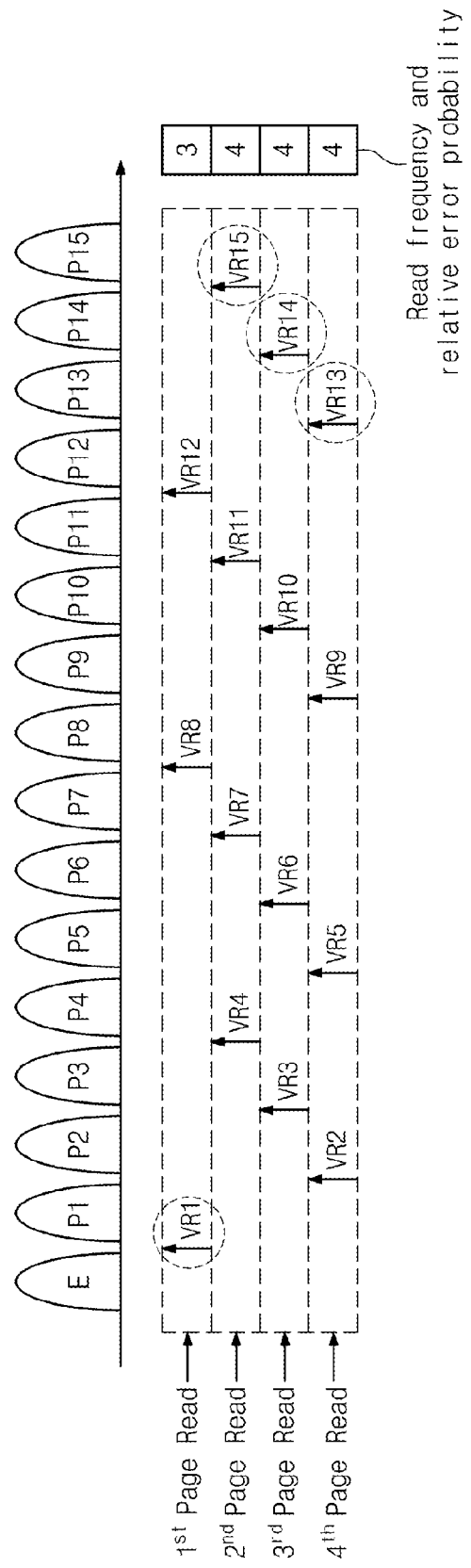
FIG. 10 is a drawing for explaining a read operation of an example embodiment of a memory cell storing 4-bit data.

FIG. 10 is a drawing for explaining a read operation of an example embodiment of a memory cell storing 4-bit. Referring to FIG. 10, the memory cell may have sixteen different threshold voltage states. Nonvolatile memory device 300 can output data stored in the memory cell by page read operations (1st page read, 2nd page read, 3rd page read, 4th page read).

First page data can be read by read voltages VR1, VR8 and VR12. Second page data can be read by read voltages VR4, VR7, VR11 and VR15. Third page data can be read by read voltages VR3, VR6, VR10 and VR14. Fourth page data can be read by read voltages VR2, VR5, VR9 and VR13. Thus, assuming the error probability is the same for all read voltages, an error probability distribution of the read method illustrated in FIG. 10 is 3:4:4:4. However, in similarity to the example shown in FIG. 4, the read voltages VR1, VR13, VR14 and VR15 have a higher occurrence frequency of a bit read error compared to the other read voltages. Accordingly, as illustrated in FIG. 10, the read voltages VR1, VR13, VR14 and VR15 having a higher occurrence frequency of a bit read error can be used in different page read operations than each other. According to a read method of a memory cell illustrated in FIG. 10, the page read operations (1st page read, 2nd page read, 3rd page read, 4th page read) may have a uniform error occurrence probability.

Figure 11:
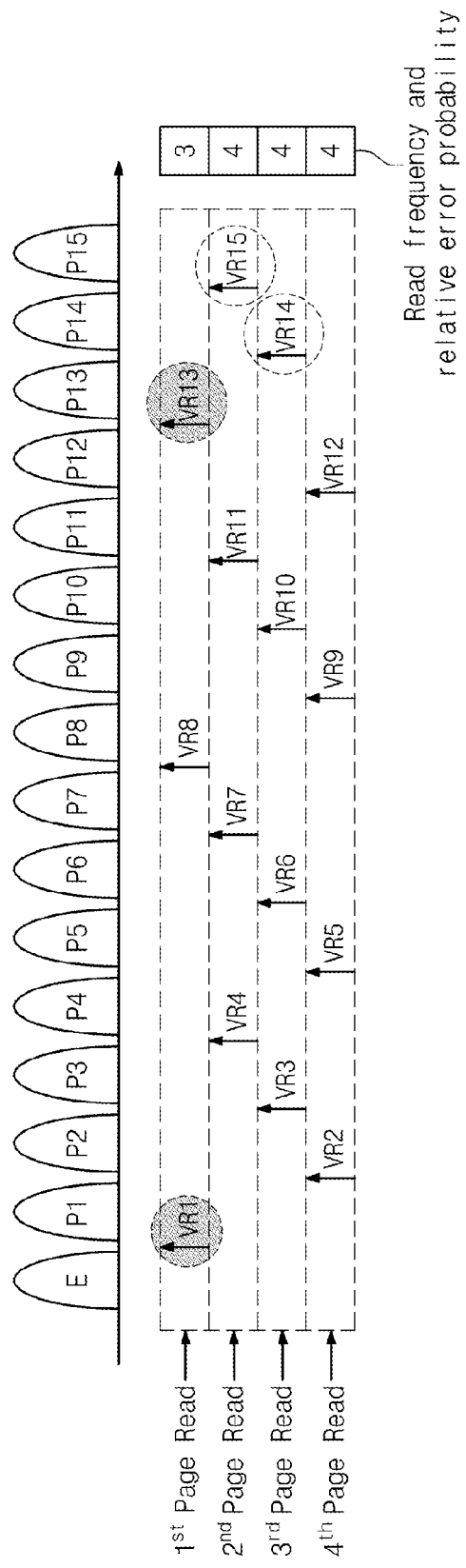
FIG. 11 is a drawing for explaining a read operation of another example embodiment of a memory cell storing 4-bit data.

FIG. 11 is a drawing for explaining a read operation of another example embodiment of a memory cell storing 4-bit data. Referring to FIG. 11, the memory cell may have sixteen different threshold voltage states. Nonvolatile memory device 300 can output data stored in the memory cell by page read operations (1st page read, 2nd page read, 3rd page read, 4th page read).

First page data can be read by read voltages VR1, VR8 and VR13. Second page data can be read by read voltages VR4, VR7, VR11 and VR15. Third page data can be read by read voltages VR3, VR6, VR10 and VR14. Fourth page data can be read by read voltages VR2, VR5, VR9 and VR12. Thus, assuming the error probability is the same for all read voltages, an error probability distribution for reading first through fourth page data, respectively, with the read method illustrated in FIG. 11 is 3:4:4:4. However, in similarity to the example shown in FIG. 4, the read voltages VR1, VR13, VR14 and VR15 have a higher occurrence frequency of a bit read error compared to the other read voltages. Accordingly, as illustrated in FIG. 10, the read voltages VR1 and VR13 having a higher occurrence frequency of bit read error can be used together in a page read operation (1st page read) having a lower error probability distribution. According to a read method of a memory cell illustrated in FIG. 11, the page read operations (1st page read, 2nd page read, 3rd page read, 4th page read) may have a uniform error occurrence probability.

According to the read methods illustrated in FIGS. 8 through 11, each page data can be read by read voltages assigned to each page read operation to have a uniform error occurrence distribution. Read voltages having a relatively higher occurrence frequency of a bit read error at the end of life of a memory cell may be used in different page read operations. Thus, the page read operations can be performed with a uniform error occurrence probability.

Figure 12:
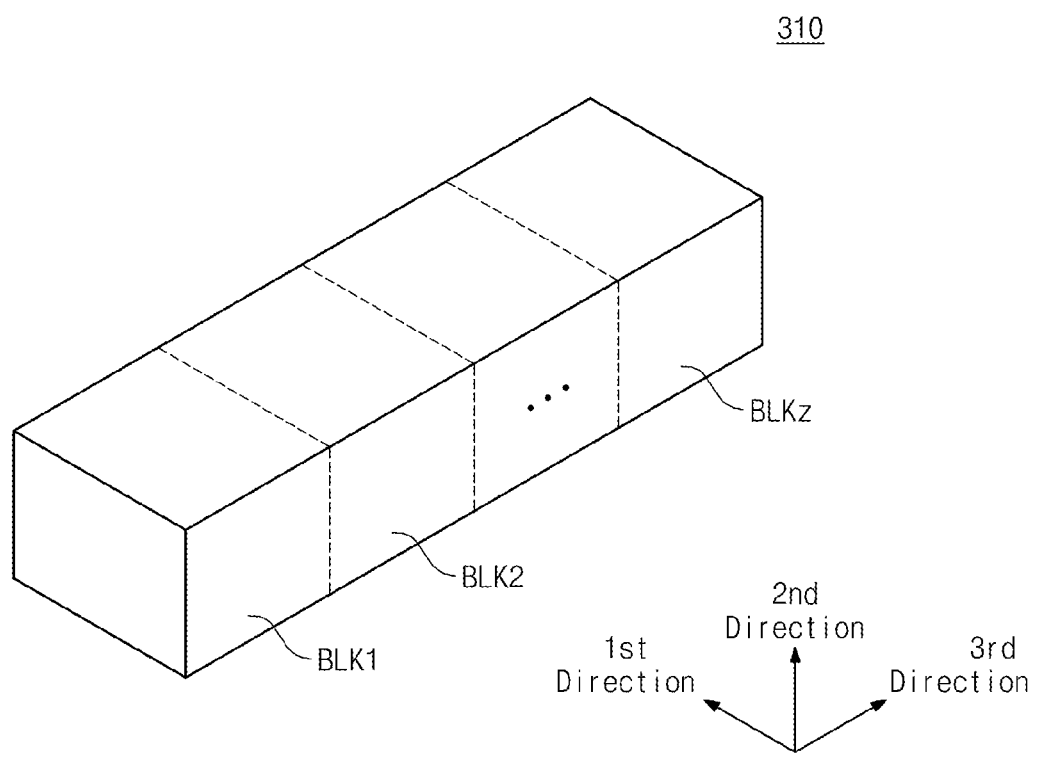
FIG. 12 is a block diagram illustrating an example of a memory cell array of FIG. 6.

Reviewing FIGS. 8-11 and the accompanying descriptions above, one can make the following observations regarding some embodiments. Assuming that the number of bits stored in the multi-level memory cells of a memory device is N, then the number of pages of data and the number of page read operations for the multi-level memory cells may also be N. The total number of read voltages may be $2^{(N-1)}$, with the largest number of read voltages used in any page read operation being N and the smallest number of read voltages used in any page read operation being N−1. In some embodiments, the N read voltages which are associated with the highest probability of occurrence of a bit read error among the $2^{(N-1)}$ read voltages each may be used in a different one of the N page read operations than each other. In some embodiments, two or more of the N read voltages which are associated with the highest probability of occurrence of a bit read error among the $2^{(N-1)}$ read voltages may both be used in the same page read operation as each other, particularly the page read operation which uses the least number of read voltages (e.g., uses N−1 read voltages). In that case, the remaining ones of the N read voltages which are associated with the highest probability of occurrence of a bit read error among the $2^{(N-1)}$ read voltages may be used in a different one of the N page read operations than each other. FIG. 12 is a block diagram illustrating an example of memory cell array 310 of FIG. 6. Referring to FIG. 12, memory cell array 310 may include a plurality of memory blocks BLK1~BLKz. Each memory block BLK has a three-dimensional structure (or a vertical structure). For example, each memory block BLK may include structures extending along first through third directions (x, y, z). For example, each memory block BLK may include a plurality of NAND cell strings along the third direction (z).

Each NAND cell string may be connected to a bit line BL, a string select line SSL, a ground select line GSL, word lines WLs and a common source line CSL. Each memory block may be connected to a plurality of bit lines BLs, a plurality of string select lines SSLs, a plurality of ground select lines GSLs, a plurality of word lines WLs and a common source line CSL.

Figure 13:
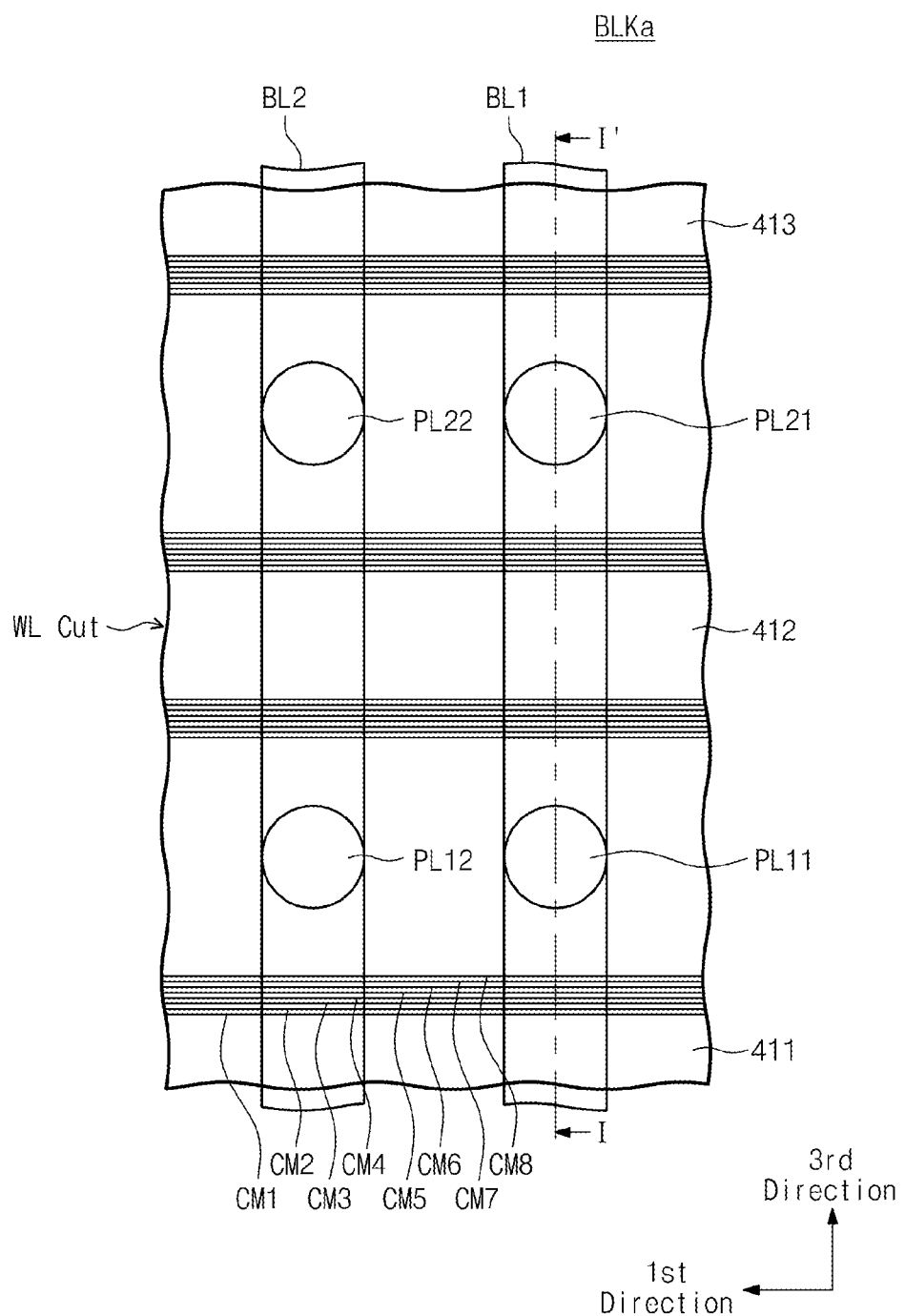
FIG. 13 is a top plan view illustrating a structure of one memory block BLKa among memory blocks BLK1~BLKz of FIG. 12.
Figure 14:
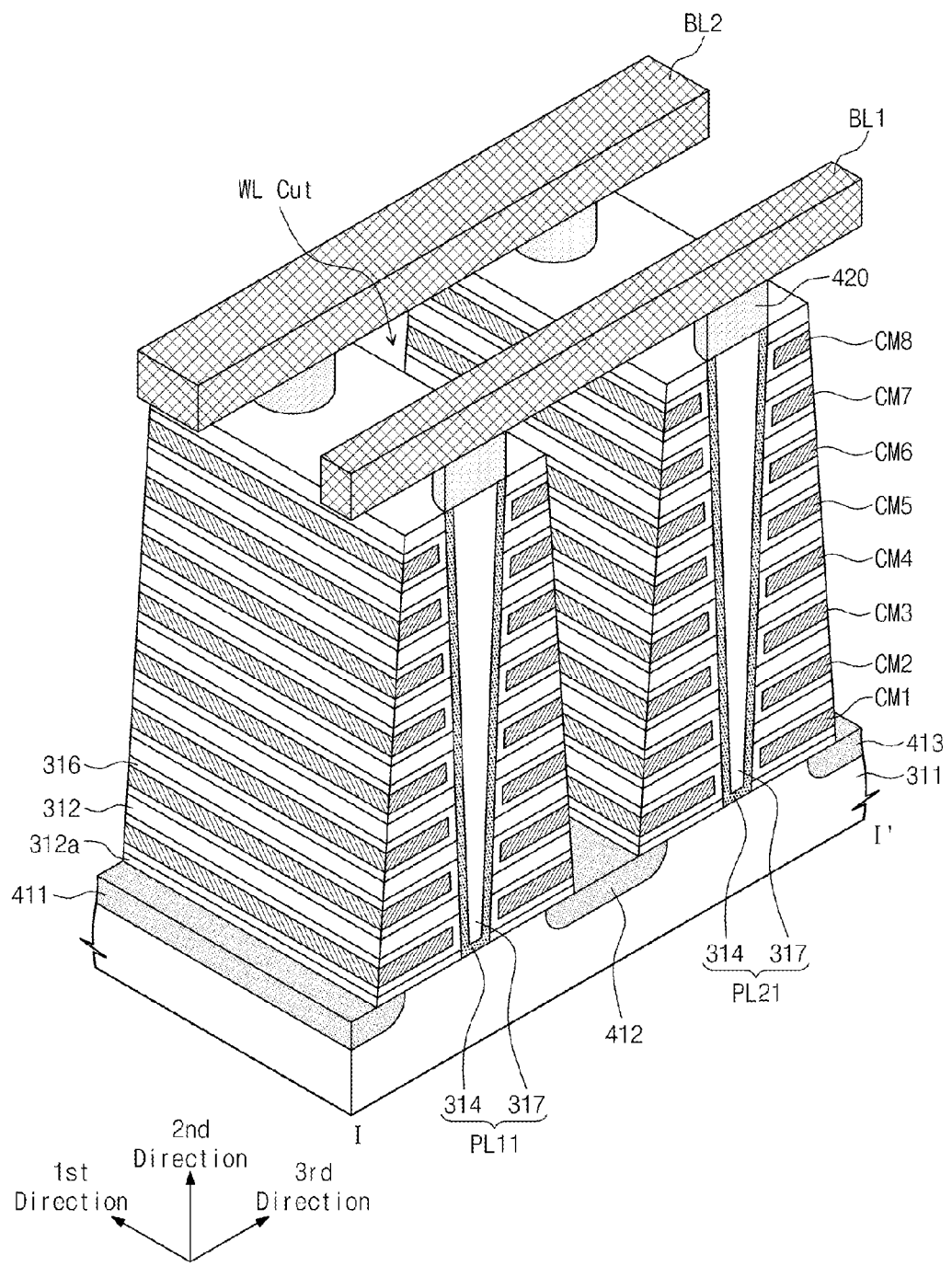
FIG. 14 is a prospective cross sectional view illustrating a structure of one memory block BLKa among memory blocks BLK1~BLKz of FIG. 12.

FIGS. 13 and 14 are a top plan view and a prospective cross sectional view illustrating a structure of one memory block BLKa among memory blocks BLK1~BLKz of FIG. 12. A top plan view of conductive layers of memory block BLKa is illustrated in FIG. 13. FIG. 14 illustrates an example of a perspective cross sectional view taken along the line I-I' of memory block BLKa of FIG. 13.

Referring to FIGS. 13 and 14, memory block BLKa may include structures extending along first through third directions. A substrate 311 may be a well having a first conductivity type. For example, substrate 311 may be a P well into which a group III element like boron (B) is implanted. For example, substrate 311 may be a pocket P well being provided inside an N well. Hereinafter, it is assumed that substrate 311 is a P well (or a pocket P well). However, substrate 311 is not limited to have a P conductivity type.

A plurality of doping regions 411~413 each extending along the first direction may be provided on substrate 311. Doping regions 411~413 may be formed to be spaced a predetermined distance apart from one another along the third direction on substrate 311. Doping regions 411~413 are sequentially defined as a first doping region 411, a second doping region 412 and a third doping region 413.

First through third doping regions 411~413 each may have a second conductivity type different from substrate 311. For example, first through third doping regions 411~413 may have an N conductivity type. Hereinafter, it is assumed that first through third doping regions 411~413 have an N conductivity type. However, first through third doping regions 411~413 are not limited to have an N conductivity type.

Between two doping regions among first through third doping regions 411~413, a plurality of insulating materials 312 and 312a may be sequentially provided on substrate 311 along the second direction (that is, a direction perpendicular to substrate 311). Insulating materials 312 and 312a may be provided to be separated a predetermined distance from one another along the second direction. Insulating materials 312 and 312a each may extend along the first direction. Insulating materials 312 and 312a each may include an insulating material like a silicon oxide layer. A thickness of insulating material 312a which is in contact with substrate 311 among insulating materials 312 and 312a may be less than the thickness of the remaining insulating materials 312.

Between two doping regions among first through third doping regions 411~413, a plurality of pillars PL11, PL12, PL21 and PL22 may be provided which are sequentially disposed along the first and third directions and penetrate insulating materials 312 and 312a. Pillars PL11, PL12, PL21 and PL22 can penetrate insulating materials 312 and 312a to contact substrate 311.

Each of pillars PL11, PL12, PL21 and PL22 may be constituted to have a multilayer structure. Pillars PL11, PL12, PL21 and PL22 may include channel layers 314 and internal materials 317. In each of pillars PL11, PL12, PL21 and PL22, an internal material and a channel layer surrounding the internal material may be provided.

Channel layers 314 may include a semiconductor material (e.g., silicon) having the first conductivity type. For example, channel layers 314 may include a semiconductor material (e.g., silicon) having the same conductivity type as substrate 311. Hereinafter, it is assumed that channel layers 314 include P type silicon. However, channel layers 314 are not limited to include P type silicon. For example, channel layers 314 may include an intrinsic semiconductor having no conductivity type.

Internal materials 317 may include an insulating material. For example, internal materials 317 may include an insulating material such as silicon oxide. Internal materials 317 may include an air gap.

Between two doping regions among first through third doping regions 411~413, information storage layers 316 may be provided on exposed surfaces of insulating materials 312 and 312a and pillars PL11, PL12, PL21 and PL22. A thickness of information storage layers 316 may be smaller than a distance between insulating materials 312 and 312a.

Between two doping regions among first through third doping regions 411~413, conductive materials CM1~CM8 may be provided on exposed surfaces of information storage layers 316. In further detail, conductive materials CM1~CM8 extending along the first direction may be provided between an information storage layer provided on a bottom surface of an upper insulating material and an information storage layer provided on a top surface of a lower insulating material.

On doping regions 411~413, conductive materials CM1~CM8 and insulating materials 312 and 312a can be divided by a word line cut. Conductive materials CM1~CM8 may include a metallic conductive material. Conductive materials CM1~CM8 may include a non-metallic conductive material such as poly silicon.

An information storage layer provided on a top surface of the upper most insulating material among insulating materials 312 and 312a may be removed. An information storage layer provided on a side surface facing pillars PL11, PL12, PL21 and PL22 among side surfaces of insulating materials 312 and 312a may be removed.

A plurality of drains 420 may be provided on pillars PL11, PL12, PL21 and PL22. Drains 420 may include a semiconductor material (e.g., silicon) having the second conductivity type. For example, drains 420 may include a semiconductor material (e.g., silicon) having an N conductivity type. Hereinafter, it is assumed that drains 420 include N type silicon. However, drains 420 are not limited to include N type silicon. For example, drains 420 may extend on a top surface of channel layers 314 of pillars PL11, PL12, PL21 and PL22.

Bit lines BL1 and BL2 which extend along the third direction and are separated from each other by a predetermined distance in the third direction may be provided on drains 420. Bit lines BL1 and BL2 are connected to drains 420. Drains 420 and bit lines BL1 and BL2 are connected to each other through contract plugs (not shown). Bit lines BL1 and BL2 may include a metallic conductive material. Bit lines BL1 and BL2 may include may include a non-metallic conductive material such as poly silicon.

Rows and columns of pillars PL11, PL12, PL21 and PL22 of memory block BLKa are defined. Rows of pillars PL11, PL12, PL21 and PL22 are defined depending on where conductive materials CM1~CM8 are separated from one another or not. Conductive materials CM1~CM8 are separated from one another with second doping region 412 as the center.

Pillars PL11 and PL12 combined with each other through conductive materials CM1~CM8 and information storage layers 316 being provided between first doping region 411 and second doping region 412 are defined as pillars of a first row. Pillars PL21 and PL22 combined with each other through conductive materials CM1~CM8 and information storage layers 316 being provided between second doping region 412 and third doping region 413 are defined as pillars of a second row.

Columns of pillars PL11, PL12, PL21 and PL22 are defined according to bit lines BL1 and BL2. Pillars PL11 and PL21 connected to first bit line BL1 through drain 420 are defined as pillars of a first column. Pillars PL12 and PL22 connected to second bit line BL2 through drain 420 are defined as pillars of a second column.

Heights of conductive materials CM1~CM8 are defined. Conductive materials CM1~CM8 have first through eighth heights according to their distances from substrate 311. First conductive material CM1 closest to substrate 311 has the first height. Eighth conductive material CM8 closest to bit lines BL1 and BL2 has the eighth height.

Each of pillars PL11, PL12, PL21 and PL22 constitutes a cell string together with adjacent conductive materials CM1~CM8 and adjacent information storage layers 316. That is, pillars PL11, PL12, PL21 and PL22 constitute a plurality of cell strings together with adjacent conductive materials CM1~CM8 and adjacent information storage layers 316.

Figure 15:
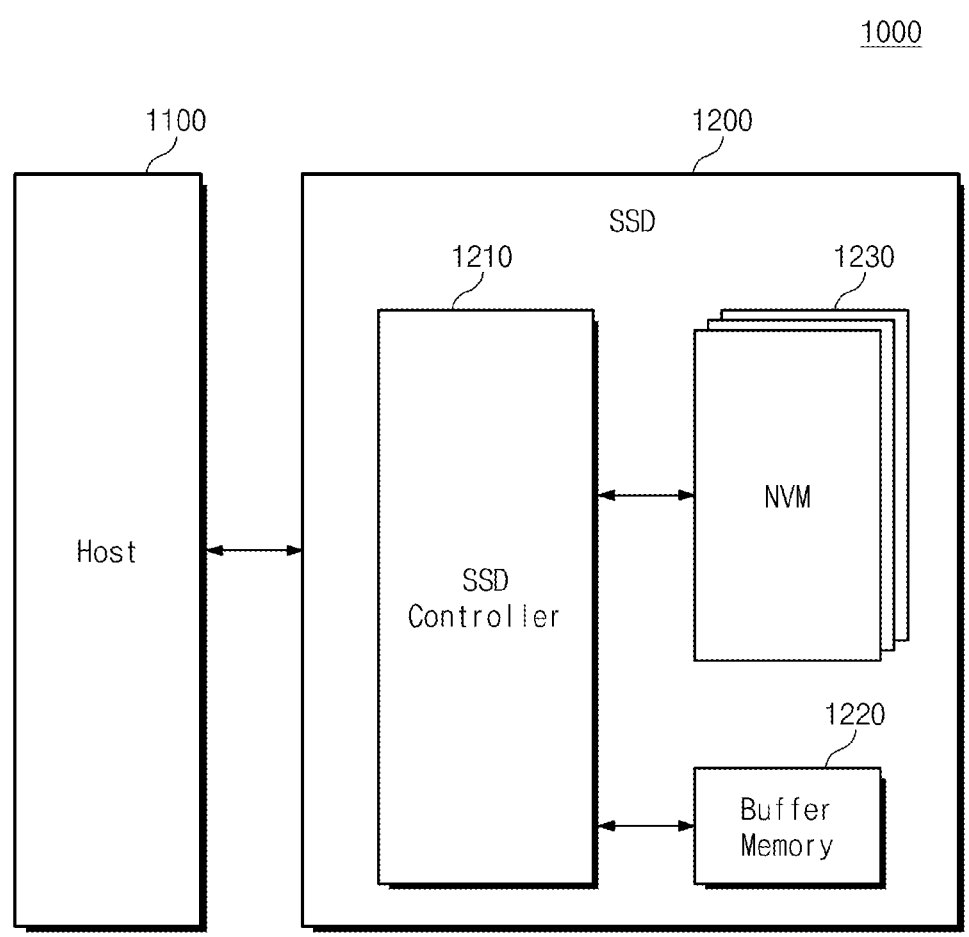
FIG. 15 is a block diagram illustrating an example embodiment of a user device including a solid state disk (SSD).

FIG. 15 is a block diagram illustrating an embodiment of a user device including a solid state disk (SSD). Referring to FIG. 15, a user device 1000 may include a host 1100 and a SSD 1200. SSD 1200 may include a SSD controller 1210, a buffer memory 1220 and a nonvolatile memory device 1230.

SSD controller 1210 may provide a physical connection between host 1100 and SSD 1200. That is, SSD controller 1210 can provide an interfacing with SSD 1200 in response to a bus format of host 1000. SSD controller 1210 can decode a command being provided from host 1000. According to the decoded result, SSD controller 1210 can access nonvolatile memory device 1230. Examples of the bus format of host 1100 may include a universal serial bus (USB), a small computer system interface (SCSI) bus, a peripheral component interconnect (PCI) express bus, an advanced technology attachment (ATA) bus, a parallel ATA (PATA) bus, a serial ATA (SATA) bus, a serial attached SCSI (SAS) bus, etc.

SSD controller 1210 can decode a read request from host 1100 to select any one of a partial page read mode and an overall page read mode. SSD controller 1210 can control nonvolatile memory device 1230 to access memory cells according to the corresponding read mode. For example, SSD controller 1210 can control nonvolatile memory device 1230 to set a specific read command (e.g., a partial page read command).

Buffer memory 1220 may temporarily store data being provided from host 1100 or data read from nonvolatile memory device 1230. In the case that data existing in memory device 1230 is cached when a read request of host 1100 occurs, buffer memory 1220 can support a cache function of directly providing the cached data to host 1100. Generally, a data transmission speed of data by the bus format (e.g., SATA or SAS) of host 1100 is much higher than a transmission speed of a memory channel. That is, in the case that an interface speed of host 110 is very high, performance degradation caused by a speed difference may be minimized by providing a large-capacity buffer memory.

Buffer memory 1220 may be provided by a synchronous DRAM (SDRAM) to provide a sufficient buffering to SSD 1200 being used as a large-capacity auxiliary memory device. However, buffer memory 1220 may not be limited to this example.

Nonvolatile memory device 1230 can be provided as storage medium of SSD 1200. For example, nonvolatile memory device 1230 may be provided by a NAND flash memory having a high storage capacity. Each page data of nonvolatile memory device 1230 can be read by read voltages assigned to each page read operation to have a uniform error probability distribution. Read voltages having a high occurrence frequency of a bit read error at the end of life of a memory cell can be used in different page read operations. Thus, page read operations of nonvolatile memory device 1230 can be performed to have a uniform error occurrence probability.

Nonvolatile memory device 1230 can be constituted by a plurality of memory devices. In this case, each memory device can be connected to SSD controller 1210 by a channel unit. A NAND flash memory is explained as nonvolatile memory device 1230 as storage medium but other nonvolatile memory devices may constitute nonvolatile memory device 1230. For example, a PRAM, a MRAM, an ReRAM, a FRAM, a NOR flash memory, etc. may be used as storage medium and a memory system in which different kinds of memory devices are mixed may be used. Nonvolatile memory device 1230 can be constituted to be the same as that described in FIG. 6.

Figure 16:
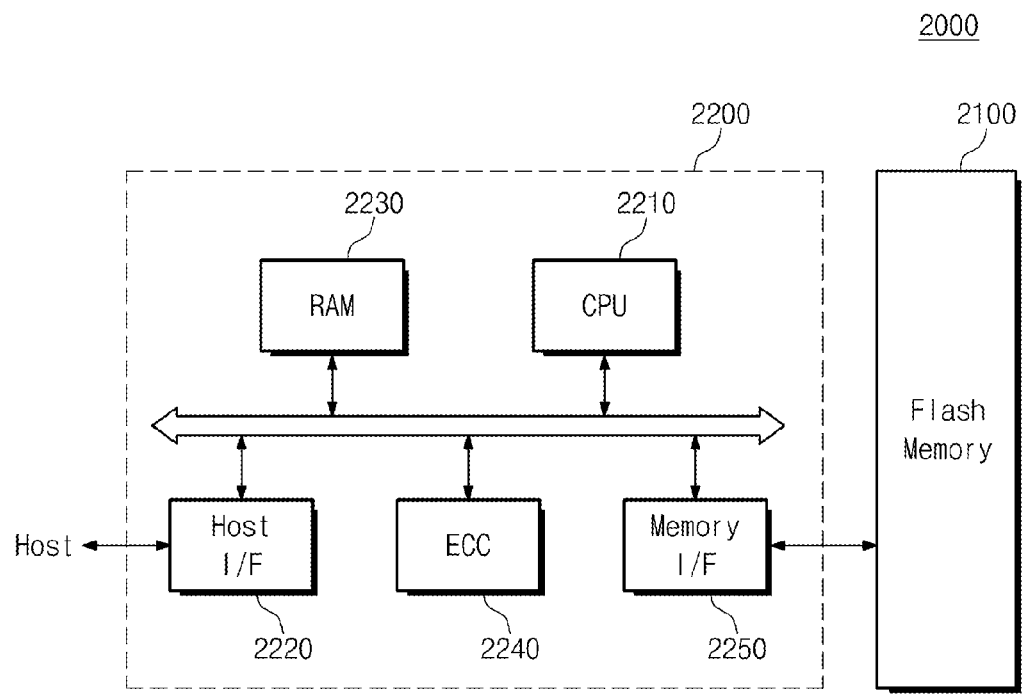
FIG. 16 is a block diagram illustrating an example embodiment of a memory system.

FIG. 16 is a block diagram illustrating an example embodiment of a memory system 2000. Referring to FIG. 16, memory system 2000 may include a memory controller 2200 and a nonvolatile memory 2100.

Nonvolatile memory 2100 can be substantially constituted to be the same as nonvolatile memory device 300 of FIG. 6. Thus, detailed descriptions of nonvolatile memory 2100 are omitted. Each page data of nonvolatile memory 2100 can be read by read voltages assigned to each page read operation to have a uniform error probability distribution. Read voltages having a high occurrence frequency of a bit read error at the end of life of a memory cell can be used in different page read operations. Thus, page read operations of nonvolatile memory 2100 can be performed to have a uniform error occurrence probability.

Memory controller 2200 can be configured to control nonvolatile memory 2100. A SRAM 2230 can be used as a working memory. A host interface 2220 may include data exchange protocols of a host being connected to memory system 2000. An error correction circuit 2240 included in memory controller 2200 can detect and correct an error included in data read from nonvolatile memory 2100. Memory interface 2250 can interface with nonvolatile memory 2100. A CPU 2210 can perform all control operations for data exchange of memory controller 2200. Although not illustrated in the drawing, memory system 2000 may further include a ROM (not shown) storing code data for interfacing with the host.

Memory controller 2200 is configured to communicate with the outside of memory system 2000 (for example, a host) through one of various interface protocols such as USB, multimedia card (MMC), PCI-E, SAS, SATA, PATA, SCSI, ESDI and IDE.

Memory controller 2200 can decode a read request from the host to select any one of a partial page read mode and an overall page read mode. Memory controller 2200 can control nonvolatile memory device 1230 to access memory cells according to the corresponding read mode. For example, memory controller 2200 can control nonvolatile memory device 1230 to set a specific read command (e.g., a partial page read command).

Memory system 2000 can be applied to one of a computer, an ultra mobile PC (UMPC), a workstation, a net-book, a personal digital assistant (PDA), a portable computer, a web tablet, a tablet computer, a wireless phone, a mobile phone, a smart phone, a digital camera, a digital audio recorder, a digital audio player, a digital picture recorder, a digital picture player, a digital video recorder, a digital video player, a device that can transmit and receive information in a wireless environment, and one of various electronic devices constituting a home network.

Figure 17:
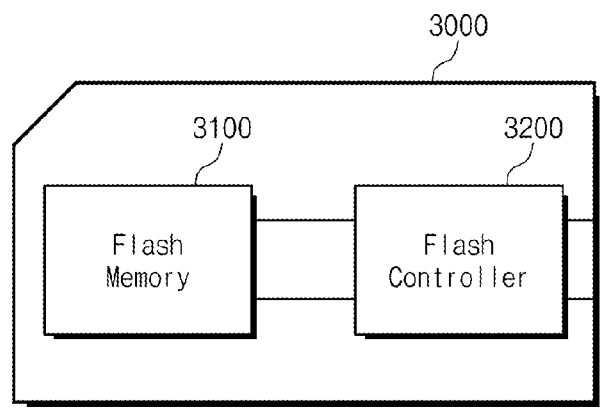
FIG. 17 is a block diagram illustrating an example embodiment of a data storage device.

FIG. 17 is a block diagram illustrating an example embodiment of a data storage device 3000. Referring to FIG. 17, data storage device 3000 may include a flash memory 3100 and a flash controller 3200. Flash controller 3200 can control flash memory 3100 on the basis of control signals received from the outside of data storage device 3000.

A constitution of flash memory 3100 can be substantially the same as the constitution of nonvolatile memory device 300 of FIG. 6. Flash memory 3100 can be constituted by one of a stack flash structure in which arrays are stacked as a multi-layer structure, a flash structure having no source-drain, a pin type flash structure and a three-dimensional flash structure. Each page data of flash memory 3100 can be read by read voltages assigned to each page read operation to have a uniform error probability distribution. Read voltages having a high occurrence frequency of a bit read error at the end of life of a memory cell can be used in different page read operations. Thus, page read operations of flash memory 3100 can be performed to have a uniform error occurrence probability.

Flash controller 3200 can decode a read request from a host to select any one of a partial page read mode and an overall page read mode. Flash controller 3200 can control flash memory 3100 to access memory cells according to the corresponding read mode. For example, flash controller 3200 can control flash memory 3100 to set a specific read command (e.g., a partial page read command).

Data storage device 3000 can constitute a memory card device, a SSD device, a multimedia card device, a SD card, a memory stick device, a hard disk drive device, a hybrid drive device, or a general purpose derail bus flash device. For example, data storage device 3000 can constitute a card satisfying industrial standards for using a user device such as a digital camera, a personal computer, etc.

Figure 18:
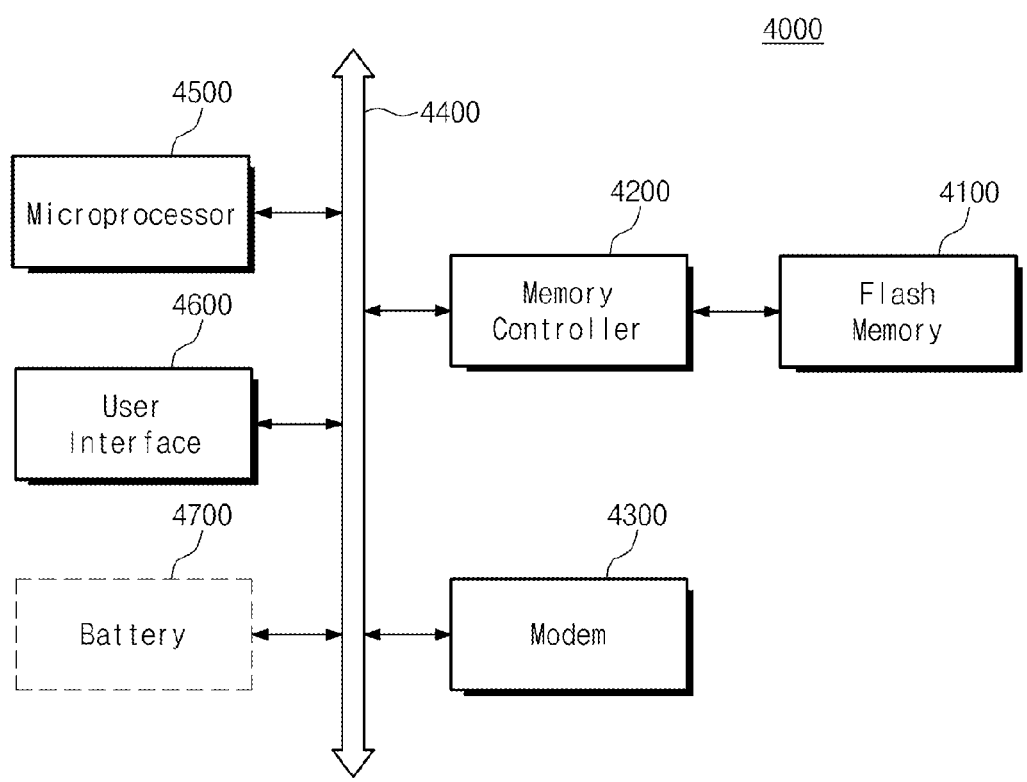
FIG. 18 is a drawing illustrating a constitution of an example embodiment of a flash memory device and a computing system including the flash memory.

FIG. 18 is a drawing illustrating a constitution of an example embodiment of a flash memory device 4100 and a computing system 4000 including flash memory device 4100. Referring to FIG. 18, computing system 4000 may include flash memory device 4100, a memory controller 4200, a modem 4300 (such as a baseband chipset), a microprocessor 4500, and a user interface 4600 that are electrically connected to a bus 4400.

Flash memory device 4100 illustrated in FIG. 18 is the same as nonvolatile memory device 100 illustrated in FIG. 1. Flash memory device 4100 can be constituted by one of a stack flash structure in which arrays are stacked as a multilayer structure, a flash structure having no source-drain, a pin type flash structure and a three-dimensional flash structure.

Flash memory device 4100 includes a cell array constituted by an all-bit line memory architecture. Flash memory device 4100 can also further perform a partial page read mode. In the partial page read mode, each page data of the flash memory device 4100 can be read by read voltages assigned to each page read operation to have a uniform error probability distribution. Read voltages having a high occurrence frequency of a bit read error at the end of life of a memory cell can be used in different page read operations. Thus, page read operations of flash memory device 4100 can be performed to have a uniform error occurrence probability.

In the case that computing system 4000 is a mobile device, a battery 4700 for supplying an operation voltage of computing system 4000 may further be provided. Although not illustrated in the drawing, an application chipset, a camera image processor, a mobile DRAM, etc. may be further provided to computing system 4000. Memory controller 4200 and flash memory device 4100 can constitute a solid state disk (SSD) using a nonvolatile memory when storing data.

A nonvolatile memory device and/or memory controller in accordance with the inventive concept can be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to exemplary embodiments of the inventive concept, a nonvolatile memory device that can improve read performance considering an occurrence frequency of a bit read error caused by repetition of a read operation, and a memory system including the nonvolatile memory device can be provided.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A nonvolatile memory device, comprising:
 a memory cell array which is arranged in rows and columns and has multi-level memory cells;
 a voltage generator which is configured to provide a plurality of read voltages to a selected row of the memory cell array; and
 control logic which is configured to perform a plurality of page read operations for the selected row of the memory cell array using the read voltages,
 wherein a first read voltage and a second read voltage among the plurality of read voltages are each associated with a higher probability of occurrence of a bit read error than at least one other read voltage among the plurality of read voltages, and
 wherein the control logic is further configured to use the first read voltage and the second read voltage in different page read operations than each other.

2. The nonvolatile memory device of claim 1, wherein the first read voltage has a lowest voltage level among the plurality of read voltages and the second read voltage has a highest voltage level among the plurality of read voltages.

3. The nonvolatile memory device of claim 2, wherein a third read voltage has a second highest voltage level among the plurality of read voltages, and a fourth read voltage has a third highest voltage level among the plurality of read voltages, and wherein the control logic is configured to use each of the first read voltage, the second read voltage, the third read voltage, and the fourth read voltage in different page read operations than each other.

4. The nonvolatile memory device of claim 1, wherein occurrence frequency of a bit read error increases at a greater rate by repeatedly performing the page read operations for the first and second read voltages than for the third read voltage.

5. The nonvolatile memory device of claim 1, wherein the control logic is configured to use the read voltages such that a difference in a number of read voltages used between the page read operations is no more than one.

6. The nonvolatile memory device of claim 5, wherein a page read operation using a least number of read voltages among the page read operations uses the first and second read voltages.

7. The nonvolatile memory device of claim 1, wherein the control logic comprises a read scheduler performing the page read operations according to assigned voltages among the read voltages.

8. The nonvolatile memory device of claim 1, wherein the control logic is configured to perform a programming operation so that input data is programmed in memory cells that belong to the selected row of the memory cell array according to a programming method corresponding to the page read operations.

9. A memory system, comprising:
 a nonvolatile memory device configured to perform a plurality of page read operations using a plurality of read voltages; and
 a controller configured to control the nonvolatile memory device to perform the page read operations,
 wherein a first read voltage and a second read voltage among the plurality of read voltages are each associated with a higher probability of occurrence of a bit read error than at least one other read voltage among the plurality of read voltages, and wherein the controller is configured to control the nonvolatile memory device to use the first read voltage and the second read voltage in different page read operations than each other.

10. The memory system of claim 9, wherein the controller comprises a state-ordering unit configured to control the nonvolatile memory device to perform the page read operations according to assigned voltages among the read voltages.

11. The memory system of claim 9, wherein the first read voltage a lowest voltage level among the plurality of read voltages and the second read voltage a highest voltage level among the plurality of read voltages.

12. The memory system of claim 11, wherein a third read voltage has a second highest voltage level among the plurality of read voltages and a fourth read voltage has a third highest voltage level among the plurality of read voltages, and wherein the control logic is configured to use each of the first read voltage, the second read voltage, the third read voltage, and the fourth read voltage in different page read operations than each other.

13. The memory system of claim 9, wherein the control logic is configured to use the read voltages such that a difference in a number of read voltages used between the page read operations is no more than one.

14. The memory system of claim 13, wherein a page read operation using a least number of read voltages among the page read operations uses the first and second read voltages.

15. The memory system of claim 9, wherein the controller is configured to control the nonvolatile memory device so that input data is programmed according to a programming method corresponding to the page read operations.

16. A memory system including a nonvolatile memory device, the nonvolatile memory device comprising:
   a memory cell array comprising a plurality of multi-level memory cells; and
   a voltage generator which is configured to provide a plurality of read voltages,
   wherein the memory device is configured to perform a plurality of page read operations on at least one multi-level memory cell among the plurality of multi-level memory cells by applying at least one of the read voltages to the one multi-level memory cell during each of the plurality of page read operations,
   wherein each of the plurality of read voltages is associated with a corresponding probability of occurrence of a bit read error,
   wherein first and second read voltages among the plurality of read voltages are associated with greatest probabilities of occurrence of a bit read error among the plurality of read voltages, and
   wherein the memory device is further configured to apply the first read voltage and the second read voltage to the one of multi-level memory cell during different page read operations than each other.

17. The memory system of claim 16, further comprising a memory controller configured to control the nonvolatile memory device to perform the page read operations, wherein the memory controller includes a state-ordering unit configured to assign bit patterns to states of threshold voltages of the one memory cell so that the first and second read voltages are used during different page read operations than each other.

18. The memory system of claim 16, wherein the memory device is configured to apply a corresponding number of the read voltages to the one multi-level memory cell during each of the plurality of page read operations, and where a difference in the numbers among all of the page read operations is no more than one.

19. The memory system of claim 16, wherein third and fourth read voltages among the plurality of read voltages are associated with greatest probabilities of occurrence of a bit read error among the plurality of read voltages except for the first and second read voltages, and wherein the memory device is further configured to apply each of the first read voltage, the second read voltage, the third read voltage, and the fourth read voltage in different page read operations than each other.

20. The memory system of claim 16, wherein third and fourth read voltages among the plurality of read voltages are associated with greatest probabilities of occurrence of a bit read error among the plurality of read voltages except for the first and second read voltages, and wherein a page read operation using a least number of read voltages among the page read operations uses two read voltages among the first read voltage, the second read voltage, the third read voltage, and the fourth read voltage.

* * * * *